(12) United States Patent
Widdershoven

(10) Patent No.: US 6,313,502 B1
(45) Date of Patent: Nov. 6, 2001

(54) SEMICONDUCTOR DEVICE COMPRISING A NON-VOLATILE MEMORY WHICH IS ERASABLE BY MEANS OF UV IRRADIATION

(75) Inventor: Franciscus P. Widdershoven, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/451,271

(22) Filed: Nov. 30, 1999

(30) Foreign Application Priority Data

Dec. 1, 1998 (EP) .................................................. 98204051

(51) Int. Cl.[7] ....................... H01L 29/788; H01L 27/108
(52) U.S. Cl. .......................... 257/323; 257/290; 257/317; 257/431; 365/185.32
(58) Field of Search ............................ 257/290, 431, 257/317, 318, 323; 365/185.29, 185.32

(56) References Cited

U.S. PATENT DOCUMENTS

| | | | |
|---|---|---|---|
| 4,144,591 | * 3/1979 | Brody | 365/228 |
| 4,236,831 | * 12/1980 | Hendrickson | 257/49 |
| 5,049,758 | * 9/1991 | Mead et al. | 365/185.21 |
| 5,315,145 | * 5/1994 | Lukaszek | 257/379 |
| 5,557,114 | * 9/1996 | Leas et al. | 257/59 |
| 6,169,318 | * 1/2001 | McGrath | 257/445 |

FOREIGN PATENT DOCUMENTS 3-62-92375 * 4/1987 (JP) ..................................... 257/323

OTHER PUBLICATIONS

Y. Berg et al., Programmable Floating–Gate MOS Logic for Low–Power Operation, IEEE International Symposium on Circuits and Systems, pp. 1792–1795, Jun. 1997.*

* cited by examiner

*Primary Examiner*—Eddie Lee
*Assistant Examiner*—George C. Eckert, II
(74) *Attorney, Agent, or Firm*—Steven R. Biren

(57) ABSTRACT

The invention proposes a simple method to lower the threshold voltage of UV erased EPROM and OTP memories. During the erasure, a voltage is applied to the control gate (10) or wordline (2) which is on-chip generated as a photovoltage by means of photodiode (12) irradiated by radiation (15) during erasure. Because the wordlines are coupled to further zones forming photosensitive pn-junctions in the semiconductor body, measures are taken to prevent that, due to charge transport across said junctions, the generated photovoltage is decreased too strongly.

8 Claims, 2 Drawing Sheets

SEMICONDUCTOR DEVICE COMPRISING A NON-VOLATILE MEMORY WHICH IS ERASABLE BY MEANS OF UV IRRADIATION

BACKGROUND OF THE INVENTION

The invention relates to a semiconductor device comprising a semiconductor body with a surface region of a first conductivity type adjoining a surface, which semiconductor body is provided at the surface with a non-volatile memory which is erasable by means of UV irradiation and which comprises a number of memory cells, each in the form of a field effect transistor with source and drain zones of the opposed, i.e. the second conductivity type, a floating gate situated above the channel between the source and drain zones, and a control gate situated above the floating gate.

Non-volatile memories are generally known. Conventional embodiments of the transistor have a floating gate of the n-channel type with source and drain zones of the n-type and a surface region of the p-type. An n-channel embodiment will be described below. In principle however, embodiments of the opposed conductivity type are also possible. Information is written in the form of electric charge on the floating gate, thus defining the threshold voltage of the transistor. Depending on the stored information, the threshold voltage in a memory cell has a (comparatively) high or a (comparatively) low value. A voltage lying between these two values is applied to the control gate for the purpose of reading, and it is ascertained whether the transistor is, or is not, conducting.

It is possible, for the purpose of writing, to provide a negative charge on the floating gate by means of injection of hot electrons from the channel of a selected cell, thereby causing the threshold voltage of the n-channel transistor to increase to a high value. The cell can be erased through irradiation with electromagnetic radiation in the UV region, hereinafter referred to as UV radiation for short. The UV radiation forms electrons in the floating gate of sufficient energy for flowing across the potential barrier of the gate oxide between the channel and the floating gate towards the semiconductor body. When a sufficient number of electrons have disappeared from the floating gate, a state with a low threshold voltage has been obtained again.

It was found in practice that the threshold voltage often does not return to its original value, for example 1.1 V, during UV erasure, but to a much higher value, for example 2 V. This high threshold voltage may give rise to problems in, for example, low-voltage or low-power applications. A memory cell which is programmed in the "ON" state (low threshold) must have a threshold voltage which is substantially lower than the supply voltage. It is indeed possible to generate higher voltages with an on-chip charge pump, but such a charge pump is often not attractive on account of its high dissipation.

SUMMARY OF THE INVENTION

Therefore, the invention has for its object to provide, inter alia, a non-volatile, UV-erasable memory in which a lower threshold voltage is obtained during UV-erasure. According to the invention, a semiconductor device of the kind described in the opening paragraph is for this purpose characterized in that means are present for generating a photovoltage during the erasure by means of UV irradiation, which photovoltage is supplied to the control gate. The invention is based inter alia on the recognition that in a thermodynamic equilibrium, when the Fermi levels are the same, a built-in voltage is present between the n-type floating gate and the p-type substrate. The n-type floating gate has a potential at room temperature which is approximately 1 V higher than the potential in the substrate in the case of a usual doping level. This potential difference prevents that all electrons applied to the floating gate during writing return to the substrate again during erasing. The application of a negative voltage to the control gate during erasing renders it possible to compensate for part of the built-in voltage, so that more electrons will disappear from the floating gate during erasing. The use of a photovoltage generated during the UV irradiation itself as the voltage applied to the control gate renders it unnecessary to use separate, external voltage sources.

A specific embodiment of a semiconductor device according to the invention is characterized in that said means comprise a photodiode in the form of a surface zone of the second conductivity type which is provided in the surface region and which is conductively connected to the control gate, said photodiode being accessible to said electromagnetic radiation over at least part of its surface area. The photodiode may at the same time act as a protection diode which protects the control gate against electrostatic breakdown which may result from a storage of electric charge on the gate during certain process steps such as, for example, plasma etching.

A major embodiment of a device according to the invention is characterized in that the memory cells are arranged in a system of rows and columns, the control gates of cells in a common row being connected to a common photodiode via a word line.

The word lines are connected not only to the photodiode, but also to the drains of an n-channel MOST and a p-channel MOST via an output of a decoder circuit. By means of the photovoltage generated by the photodiode, it is possible, for example in the case of an n-channel floating gate transistor whose control gate is connected to the cathode of the photodiode, to bias the pn junction between the n-type drain of the n-channel MOST and the p-type surface region in the forward direction, which can cause a reduction in the photovoltage. This reduction can be easily restricted to an acceptable level, for example in that the surface area of the drain is made as small as possible. A greater leakage current is caused by the connection between the word line and the p-type drain of the p-channel MOST of the decoder circuit. The p-channel MOST is formed in an n-well which is provided in the p-type surface region and which forms a photosensitive pn junction having a comparatively large surface area with the p-type surface region. The drain together with the n-well and the p-type surface region forms a vertical pnp transistor whose emitter is formed by the p-type surface region, the base is formed by the n-well, and the collector is formed by the p-type drain, the base current being supplied by the photocurrent across the pn junction of well and surface region. A preferred embodiment of a semiconductor device according to the invention is characterized in that the memory is provided with a decoder circuit comprising a field effect transistor with a surface region, hereinafter referred to as well, of the second conductivity type in which a source and a drain of the first conductivity type of the transistor are provided, while the word line is connected to the drain, and means are present for shielding the well at least locally against incident UV radiation. Shielding the well at least locally reduces the photocurrent in the well, and thus also the current level of said parasitic transistor. A preferred embodiment of a semiconductor device according to the invention is characterized in that further means are present for suppressing parasitic transistor action between the drain, the well, and the surface region of the first conductivity type. A first embodiment is characterized in that said further means comprise a heavily doped surface zone of the second conductivity type which is provided next to the well in the surface region of the first conductivity type and which is conductively connected to this surface region. The well, the surface region of the first conductivity type, and the heavily doped surface zone of the second conductivity type form the emitter, the base and the collector, respectively, of a lateral bipolar transistor with a short-circuited base-collector junction. Part of the generated photocurrent which is collected by the well is drained off to the substrate by this transistor, so that also the current in said vertical parasitic transistor is reduced. A second embodiment is characterized in that said further means comprise a surface zone of the first conductivity type formed in the well and conductively connected to the well. This surface zone forms the collector of an additional bipolar transistor whose base and emitter are formed by the well and the surface region of the first conductivity type, respectively, the base and the collector being short-circuited. This transistor also brings about a reduction in the leakage current through the parasitic transistor connected to the word line, and thus an increase in the photovoltage generated by the photodiode. Although the invention is perfectly suitable for use in stand-alone memories, particular advantages are obtained in embedded memories where the memory is combined with a standard CMOS or a BICMOS circuit, because few extra process steps are required in addition to the standard CMOS or BICMOS process steps on account of the possible low voltages.

BRIEF DESCRIPTION OF THE DRAWING

These and other aspects of the invention will be explained in more detail with reference to an embodiment. In the drawing.

DESCRIPTION OF THE PREFERRED EMBODIMENTS

Figure 1:
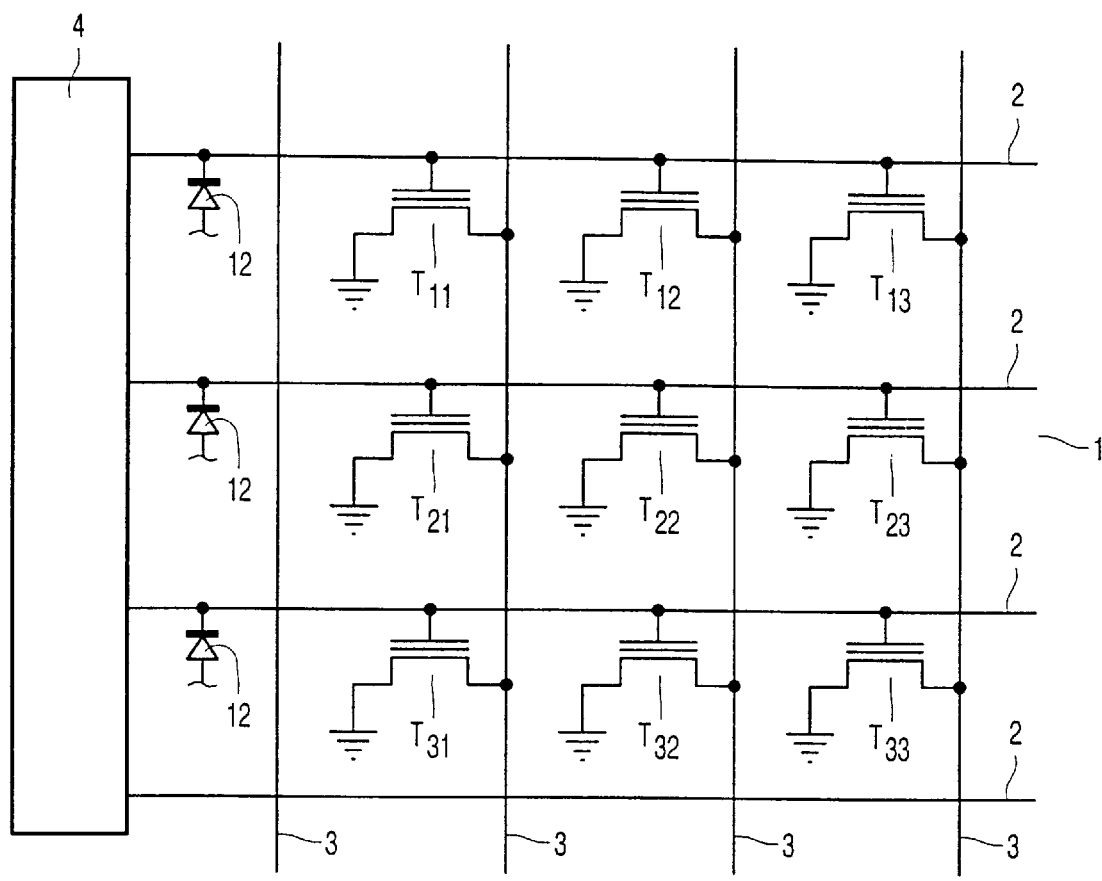
FIG. 1 shows part of a non-volatile memory according to the invention.

FIG. 1 shows a diagram of a Flash EPROM according to the invention. In this example, the memory comprises a 3 by 3 matrix, but it will be obvious that in real-life embodiments the numbers of rows and columns can be much greater. The memory 1 comprises a system of intersections of word lines 2 and bit lines 3. The memory cells are at the intersections of the word and bit lines and each comprise a field effect transistor $T_{ij}$ with a floating gate, the indices i and j referring, respectively, to the row number and the column number of a cell. The bit lines 3 run in the vertical direction and are connected to the drains of transistors in a common column and are connected to a decoder circuit and/or a read-out circuit, which are not shown in the drawing. The sources of the transistors T are connected to a common reference point, for example ground. The word lines 2 are each connected to the control gates of the transistors T in a common row and are controlled by a decoder circuit 4.

Figure 2:
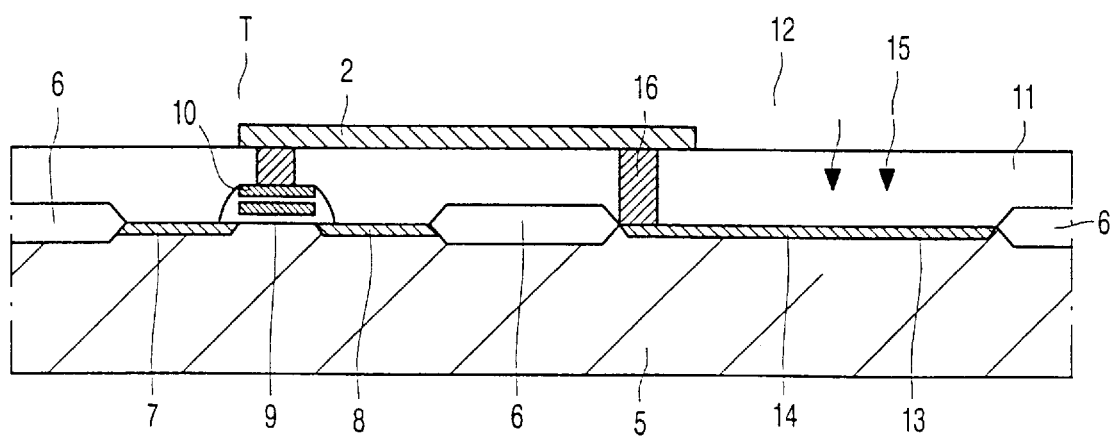
FIG. 2 is a first cross-section through the device of FIG. 1.

The cross-sectional view of FIG. 2 diagrammatically shows a floating gate transistor T. The memory matrix is formed in a silicon body of which at least the surface region 5 adjoining the surface is of the p-type. Active regions are defined in the surface region by means of the pattern 6 of field oxide, for example LOCOS. The transistor comprises an n-type source 7 and an n-type drain 8. The zones 7 and 8 may be elongate zones which extend over the fall length of a column, perpendicularly to the plane of drawing, and form a common source or drain for the cells of this column. Obviously, alternative configurations may be used, for example a configuration in which the sources comprise elongate zones parallel to the word lines, while the drains are formed by individual zones which are connected to one another column by column by the bit lines. A floating gate 9 and a control gate 10 which are electrically insulated from the channel and from one another by electrically insulating layers in a usual manner, are provided above the channel region between the source and the drain. The device is coated with an insulating layer 11, for example made of silicon oxide, in which contacts are formed through which the control gate 10 is connected to the word line 2 which is formed by a metal track, for example made of aluminum.

Positive voltages are applied to the bit line and the word line of a selected cell for the purpose of writing, for example for testing the device. In the selected cell, electrons are formed having sufficient energy for flowing via the gate oxide to the floating gate, so that negative electric charge is stored on the floating gate. This charge state of the floating gate corresponds to a high threshold voltage of the transistor. The other charge state, in which the floating gate is electrically neutral or substantially neutral, corresponds to a low threshold voltage.

During reading, a voltage lying between the high and the low threshold voltage is applied to the control gate via the word line, and it is ascertained whether the transistor is, or is not, conducting.

Erasure takes place in a manner known per se by means of irradiation with short-wave radiation, in particular UV radiation, by which all cells of the memory matrix can be erased simultaneously. The UV radiation causes energetic electrons to be generated in the floating gate and in the channel region of the transistor with an energy which is so high that charge transport between the floating gate and the substrate via the gate oxide is possible. To prevent under-erasure as much as possible, the device according to the invention is provided with means 12 by which a photovoltage is generated during the UV irradiation which is applied to the control gate of the memory cells and which induces a field in the gate structure which counteracts the supply of electrons to the floating gate. These means 12 in the present example comprise a photodiode formed by an n-type surface zone 13 which forms a photosensitive pn junction 14 with the p-type surface region 5. The zone 13, which is connected to the control gate 10 via a contact 16, or at least the immediate surroundings of the zone 13 in the p-type surface region 5 which is depleted, is accessible to the UV radiation 15 over the major portion of its surface area so as to obtain a photovoltage which is as high as possible.

As the diagram of FIG. 1 shows, the memory cells of the matrix are provided row by row with a common photodiode 12 whose cathode is connected to the word line 2 of the respective row. It is noted in this connection that the word lines in conventional memories are often connected to a protection diode so as to protect the device during manufacture against damage caused by electrostatic discharges (ESD). Such an ESD may be the result of, for example, plasma etching during which electric charge is locally stored and can be drained off through the protection diode. Such a protection diode, whose function can be fulfilled by the photodiode 12, is unnecessary in the device described here.

Figure 5:
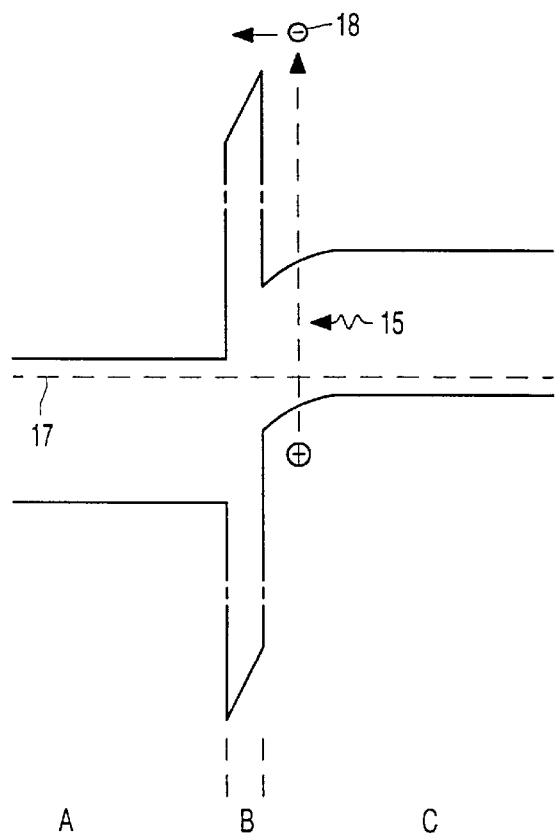
FIG. 5 is a band diagram of the MOS structure formed between a floating gate and the semiconductor body, as used in the device of FIG. 1.

The operation of the device will now be described, partly with reference to the energy diagram of FIG. 5. In this Figure, the regions A, B and C represent the valency band and the conduction band of the n-type floating gate 9, the subjacent gate oxide, and the p-type channel region, respectively, of a memory transistor. The energy level shown with a broken line 17 is the Fermi level. The potential settings of the various regions are such that the Fermi levels in the regions A, B and C are the same when external voltage sources and a non-neutralized electric charge on the floating gate are absent. An electric field caused by the potential difference between the n-type floating gate and the p-type channel prevails in the region B (gate oxide). When energetic electrons 18 are generated in this situation through absorption of UV radiation 15, these electrons will drift across the gate oxide to the floating gate owing to the electric field. This charge transport does not stop until after the electric field across the gate oxide has become zero, or at least substantially zero, as a result of the electrons transported to the floating gate.

Assuming that no charge transport is possible between the floating gate and the control gate during UV erasure, the equilibrium situation after a long period of erasing is defined by the electron transport across the gate oxide. The electric field across the gate oxide will eventually disappear at least substantially, irrespective of the voltage applied to the control gate during erasure. As long as there is still a field, charge transport will take place between the floating gate and the substrate. Electrons will be transported from the floating gate to the substrate or vice versa, in dependence on the direction of the field, which depends inter alia on whether the cell is, or is not, programmed. This transport is possible because UV radiation penetrating the gate oxide between the substrate and the floating gate is absorbed both in the substrate and in the floating gate, so that energetic electrons are generated on either side of the gate oxide. In actual fact, the field across the gate oxide will not disappear completely because there is some overlap between the floating gate and the source/drain of the transistor and because the electron concentration in the floating gate is much higher than in the p-type surface region 5. This residual field is not dependent on the voltage on the control gate 10. This voltage does determine the quantity of charge stored in the capacitance between the control gate and the floating gate. A negative voltage on the control gate 10 leads to a positive charge on the floating gate. This additional positive charge causes a lowering of the threshold voltage equal to, or at least substantially equal to, the voltage on the control gate.

If a low-pressure Hg-vapor discharge lamp is used as the UV radiation source then, as has been proved experimentally, approximately 83% of the optical power is formed by radiation with a wavelength of 254 nm, with which a photovoltage of approximately −0.5 V can be obtained. By applying said voltage to the control gate during erasure, a threshold voltage of approximately 1.3 V was obtained during erasure, in a specific embodiment, an initial threshold voltage being approximately 1.1 V, whereas a threshold voltage of approximately 1.8 V was obtained during erasure if this voltage was not applied to the control gate.

Figure 3:
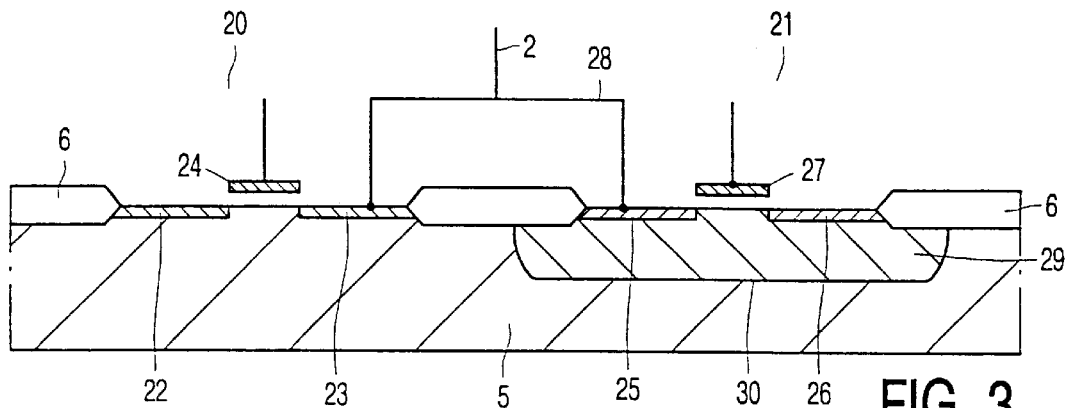
FIG. 3 is a second cross-section through the device of FIG. 1.

The decoder circuit 4 controls the word lines 2, as is diagrammatically shown in FIG. 1. Usually each word line is connected to the output of a CMOS transistor pair. As a result of this, each photodiode is connected via the word line not only to one or several control gates, but also coupled to semiconductor zones which form a pn junction in the semiconductor body. This is diagrammatically shown in FIG. 3. The output stage comprises an n-channel transistor 20 and a p-channel transistor 21. The transistors are shown diagrammatically only, and it should be noted that certain components which form standard features of transistors, such as source/drain extensions or spacers on the side walls of the gates, have not been shown for simplicity'sake. The n-channel transistor 20 comprises n-type source and drain zones 22 and 23 formed in the p-type surface region 5, and a gate 24. The p-channel transistor 21 comprises p-type source and drain zones 26 and 25, respectively, and a gate 27. The zones 25 and 26 are provided in an n-type well 29 which electrically insulates the zones 25 and 26 from the p-type surface region 5. The drain 23 of the n-channel MOST and the drain 25 of the p-channel MOST are connected to the output 28 and, via the output 28, to the word line 2. The—negative—photovoltage is applied also to the n-type zone 23 of transistor 20 via the word line 2 during erasure, so that the pn junction between the zone 23 and the p-type region becomes forward biased. The current across this pn junction may cause a reduction in the photovoltage. This reduction, however, can be restricted to an acceptably low value, for example in that the ratio between the surface areas of the photodiode 13 and the drain is made sufficiently great. It is also possible to design the device such that UV radiation is absorbed in or near to the drain 23 during erasure, with the result that the zone 23 also generates a photovoltage. A more serious problem is caused by the p-type drain 25 which is also connected to the photodiode 12 via the word line 2. The zone 25 together with the n-well 29 and the p-type surface region 5 forms a vertical pnp transistor, in which the surface region 5 is the emitter, the n-well 29 the base, and the p-type surface zone 25 the collector. During erasure, also hole-electron pairs will be generated near to the pn junction 30 between the n-well 29 and the p-type surface region 5. The holes are drained off to the substrate 5. The electrons go to the n-well 29 and supply the base current for said vertical pn transistor (5, 29, 25). This transistor becomes conducting, so that the photovoltage supplied by the photodiode 12 would be considerably reduced if no measures were taken to reduce the current through the vertical pnp transistor.

Figure 4:
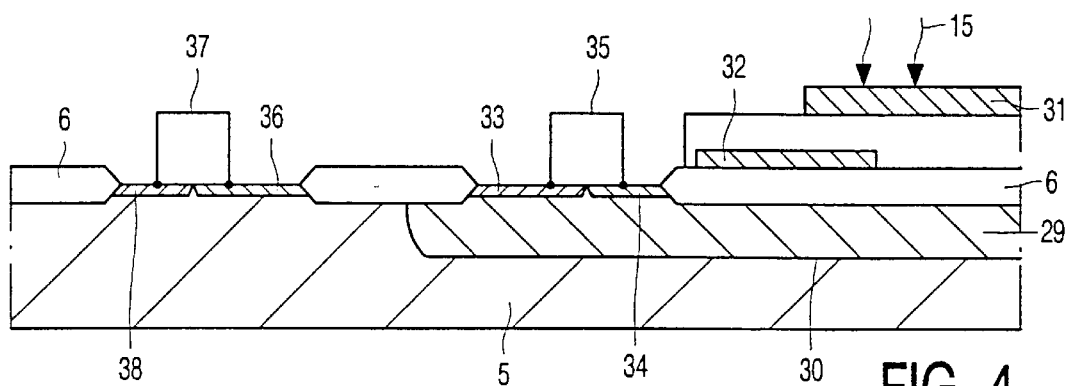
FIG. 4 is a third cross-section through the device of FIG. 1.

A set of such measures, which may be taken individually as well as in various combinations with one another, is diagrammatically shown in the cross-sectional view of FIG. 4. This Figure shows another portion of the n-well 29 than the portion shown in FIG. 3, which comprises the p-channel MOST 21. First of all, it is possible to reduce the photosensitive surface area of the pn junction 30 between the n-well 29 and the p-type surface region 5 by shielding, wherever possible, the pn junction 30 against UV radiation 15. This can be achieved with a metal layer 31, for example aluminum, which may be provided simultaneously with the wiring, or with a poly-Si layer 32 which is formed, for example, simultaneously with the gates of the transistors.

Secondly, it is possible to provide an additional pnp transistor by forming a t-type surface zone 33 in the n-well 29, which surface zone is short-circuited with the well 29 through the diagrammatically depicted metal connection 35 and a heavily doped n-type surface zone 34. The p-type surface region 5, the n-well 29, and the p-type zone 33 again form a vertical pnp transistor with short-circuited collector and base (33, 29) and with the p-type region 5 as its emitter. The current through this transistor is fed back to the n-well, so that the photocurrent in the n-well is effectively reduced, and thus also the base current in the pnp transistor between the p-type drain 25 and the p-type surface region 5.

A third measure, shown in FIG. 4, comprises the provision of an n-type surface zone 36 along the edge of the n-well 29. The n-type zone 36 is connected to the p-type surface region 5 via the diagrammatically depicted short-circuit 37 and the heavily doped p-type surface zone 38. The zone 36 forms the collector of a lateral npn transistor whose emitter and base are formed by the n-well 29 and the p-type surface region 5, respectively. The npn transistor is in the conducting state owing to the low voltage of the n-well, so that a portion of the photocurrent collected by the n-well is drained off through this transistor. The zone 36 additionally acts as a guard ring which collects a portion of the electrons generated through absorption of the UV radiation near the pn junction 30. This reduces the base current in the vertical pnp transistor between the drain 25 and the surface region 5, and thus also the current through the vertical pnp transistor.

It was found to be possible in a circuit in which these three measures were used in combination to generate an effective photovoltage of −0.44 V which, when applied to word lines, brought about a reduction of approximately 0.4 V of the threshold voltage in the UV-erased cells, so that the threshold voltage returned almost to its initial value, i.e. the value before programming.

The invention may be used to advantage in memories which are to be written and erased more than once. The invention is of particular importance, however, for non-volatile memories which are written/programmed only once (OTP=One Time programmable). The cells in such devices are programmed during testing and subsequently erased by means of UV radiation, after which the device can be definitively programmed by the user. A low threshold voltage with a value equal to, or substantially equal to, the original value is often of major importance here, for example in low-voltage applications or low-power applications, such as in battery-operated appliances.

It will be obvious furthermore that the invention is not limited to the example described here, but that many more variations are possible to those skilled in the art within the scope of the invention. The invention may be used to advantage in embodiments in which the source/drain regions are silicided. Depending on the process used, it is possible for the photodiode to be coated with metal silicide, which is impermeable to the radiation. Even then it is still possible to generate a sufficiently great photovoltage provided the portion of the t-type surface region 5 along the circumference of the silicided n-type zone 13, in which the electric field of the pn junction 14 prevails, is accessible to the radiation. It is possible to add, for example, radiation of a wavelength in the visible portion of the spectrum to the UV radiation during erasure for improving the efficacy of the photodiode.

What is claimed is:

1. A semiconductor device comprising a semiconductor body with a surface region of a first conductivity type adjoining a surface, which semiconductor body is provided at the surface with a non-volatile memory which is erasable by means of UV irradiation and which comprises a number of memory cells, each in the form of a field effect transistor with source and drain zones of a second conductivity type, a floating gate situated above a channel between the source and drain zones, and a control gate situated above the floating gate, characterized in that means are present in the surface region for generating a photovoltage during erasure by means of UV irradiation, which photovoltage is supplied to the control gate.

2. A semiconductor device as claimed in claim 1, characterized in that said means comprise a photodiode in the form of a surface zone of the second conductivity type which is provided in the surface region and which is conductively connected to the control gate, said photodiode being accessible to electromagnetic radiation over at least part of its surface area.

3. A semiconductor device as claimed in claim 2, characterized in that the memory cells are arranged in a system of rows and columns, the control gates of cells in a common row being connected to a common photodiode via a word line.

4. A semiconductor device as claimed in claim 3, characterized in that the memory is provided with a decoder circuit comprising a field effect transistor with a surface region, hereinafter referred to as well, of the second conductivity type in which a source and a drain of the first conductivity type of the field effect transistor are provided, while the word line is connected to the drain, and means are present for shielding the well at least locally against incident radiation.

5. A semiconductor device as claimed in claim 4, characterized in that further means are present for suppressing parasitic bipolar transistor action between the drain, the well, and the surface region of the first conductivity type.

6. A semiconductor device as claimed in claim 5, characterized in that said further means comprise a heavily doped surface zone of the second conductivity type which is provided next to the well in the surface region of the first conductivity type and which is conductively connected to this surface region.

7. A semiconductor device as claimed in claim 5, characterized in that said further means comprise a surface zone of the first conductivity type formed adjoining said surface, in the well and conductively connected to the well.

8. A semiconductor device as claimed in claim 1, characterized in that the memory is embedded in a CMOS or BICMOS integrated circuit.

* * * * *